(12) United States Patent
Yu (10) Patent No.: US 11,709,389 B2
(45) Date of Patent: Jul. 25, 2023

(54) DISPLAY PANEL

(71) Applicant: TCL CHINA STAR OPTOELECTRONICS TECHNOLOGY CO., LTD., Guangdong (CN)

(72) Inventor: Xiaoping Yu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 346 days.

(21) Appl. No.: 16/973,084

(22) PCT Filed: Oct. 26, 2020

(86) PCT No.: PCT/CN2020/123744
§ 371 (c)(1),
(2) Date: Dec. 8, 2020

(87) PCT Pub. No.: WO2022/047945
PCT Pub. Date: Mar. 10, 2022

(65) Prior Publication Data
US 2022/0317506 A1 Oct. 6, 2022

(30) Foreign Application Priority Data
Sep. 7, 2020 (CN) .......................... 202010926734.8

(51) Int. Cl.
| | | |
|---|---|---|
| G02F 1/1335 | (2006.01) | |
| G02F 1/1333 | (2006.01) | |
| H10K 50/86 | (2023.01) | |
| H10K 59/126 | (2023.01) | |

(Continued)

(52) U.S. Cl.
CPC .. *G02F 1/133502* (2013.01); *G02F 1/133331* (2021.01); *G02F 1/133514* (2013.01); *G02F 2202/10* (2013.01); *H10K 50/865* (2023.02); *H10K 59/126* (2023.02); *H10K 59/35* (2023.02); *H10K 2102/351* (2023.02)

(58) Field of Classification Search
CPC ........... G02F 1/133502; G02F 1/13332; G02F 1/133331
See application file for complete search history.

(56) References Cited

U.S. PATENT DOCUMENTS 9,983,705 B2 * 5/2018 Lim .......................... H05K 3/10

FOREIGN PATENT DOCUMENTS

| CN | 102243548 A | 11/2011 |
|---|---|---|
| CN | 103257731 A | 8/2013 |
| CN | 105074635 A | 11/2015 |

(Continued)

*Primary Examiner* — Dung T Nguyen (57) ABSTRACT

Embodiments of the present disclosure disclose a display panel, which includes a cover plate, a pixel layer, and a driving circuit layer. The driving circuit layer is disposed between the cover plate and the pixel layer. The driving circuit layer includes a metal layer and a darkening layer, the darkening layer is disposed on a side of the metal layer towards the cover plate, and a reflectivity of the darkening layer of external light is less than a reflectivity of the metal layer of the external light. When the external light is irradiated, the reflectivity of the darkening layer is less; therefore rainbow mura generated when the external light source illuminates the display panel.

19 Claims, 4 Drawing Sheets (51) Int. Cl.
*H10K 59/35* (2023.01)
*H10K 102/00* (2023.01)

(56) References Cited

FOREIGN PATENT DOCUMENTS

| | | |
|---|---|---|
| CN | 111048695 A | 4/2020 |
| CN | 111338118 A | 6/2020 |
| WO | 2020105327 A1 | 5/2020 |

* cited by examiner

DISPLAY PANEL

BACKGROUND OF INVENTION

Field of Invention

The present disclosure relates to the field of display technology, and specifically to a display panel.

Description of Prior Art

With development of communication technology, electronic devices such as smartphones are becoming more and more popular, and demand for lighter and thinner displays with narrow bezels is increasing. However, in the case that a thickness of the display is thinner and the bezels are narrow, when an external light source irradiates a screen, rainbow mura often appears, which causes a display effect of the display to deteriorate.

When an external light source irradiates a screen, rainbow mura often appears, which causes a display effect of the display screen to deteriorate.

SUMMARY OF INVENTION

Embodiments of the present disclosure provides a display panel, which can reduce reflection of the external light from a metal layer in the display panel, thereby reducing rainbow mura generated when the external light source irradiates the display panel.

A display panel is provided in the embodiment of the present disclosure, which comprises:
 a cover plate;
 a pixel layer; and
 a driving circuit layer disposed between the cover plate and the pixel layer, wherein the driving circuit layer comprises a metal layer and a darkening layer, the darkening layer is disposed on a side of the metal layer towards the cover plate, and a reflectivity of the darkening layer to external light is less than a reflectivity of the metal layer to the external light.

In the display panel provided in the embodiment of the present disclosure, the darkening layer comprises at least one of metal oxides, metal nitrides, and metal oxynitrides, and metal elements in the metal oxides, metal nitrides, and metal nitrides comprise molybdenum.

In the display panel provided in the embodiment of the present disclosure, chemical formulas of constituent substances of the darkening layer comprise $Mo_aX_bO_cN_d$, wherein X element in the chemical formulas comprises one element from tantalum, vanadium, nickel, niobium, zirconium, tungsten, titanium, rhenium, or hafnium, wherein in the chemical formula, a, c, and d are rational numbers greater than zero, and b is a rational number greater than or equal to zero.

In the display panel provided in the embodiment of the present disclosure, a thickness of the darkening layer ranges from 20 nanometers to 90 nanometers.

In the display panel provided in the embodiment of the present disclosure, the metal layer comprises a first metal layer and a second metal layer, and the second metal layer comprises a first side surface and a second side surface, wherein the first side surface is located towards the cover plate, the second side surface is located away from the cover plate, and the first metal layer is disposed on the first side surface of the second metal layer.

In the display panel provided in the embodiment of the present disclosure, a first orthographic projection of the first metal layer on the cover plate is spaced apart from a second orthographic projection of the second metal layer on the cover plate, wherein the darkening layer is disposed on a side of the first metal layer towards the cover plate, and/or the darkening layer is disposed on a side of the second metal layer towards the cover plate.

In the display panel provided in the embodiment of the present disclosure, a second orthographic projection of the second metal layer on the cover plate is located inside a first orthographic projection of the first metal layer on the cover plate, and the darkening layer is disposed on a side of the first metal layer towards the cover plate.

In the display panel provided in the embodiment of the present disclosure, a second orthographic projection of the second metal layer on the cover plate comprises a first part and a second part, wherein the first part is inside a first orthographic projection of the first metal layer on the cover plate, and the second part is outside the first orthographic projection; the darkening layer is disposed on the first side surface of the second metal layer corresponding to the second part, and the darkening layer is disposed on a side of the first metal layer towards the cover plate.

An isolation layer disposed between the darkening layer and the first metal layer, and the darkening layer is disposed on a side of the isolation layer towards the cover plate, wherein the first metal layer forms a first orthographic projection on the cover plate, the second metal layer forms a second orthographic projection on the cover plate, and the first orthographic projection and the second orthographic projection are both inside a third orthographic projection of the darkening layer on the cover plate.

The rainbow mura generated when the external light irritated the display panel is reduced.

DESCRIPTION OF DRAWINGS

The following detailed description of the specific implementations of the present disclosure in conjunction with the accompanying drawings will make the technical solutions and other beneficial effects of the present disclosure obvious.

DETAILED DESCRIPTION OF PREFERRED EMBODIMENTS

Technical solutions in embodiments of the present disclosure will be clearly and completely described below in conjunction with drawings in the embodiments of the present disclosure. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that the terms "first" and "second" are only used for description purposes, and cannot be understood as indicating or implying relative importance or implicitly indicating the number of indicated technical features. Therefore, the features defined with "first" and "second" may explicitly or implicitly include one or more of the features. In the description of the present disclosure, "a plurality of" means two or more than two, unless otherwise specifically defined.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

With development of display technology, display panels provide display functions for smartphones, computers, tablets, and even various smart wearable devices. Display panels have gradually realized characteristics of lightness and thinness and narrow bezels. Display panel products that are visually borderless have even appeared on the market. However, when a display panel is irradiated by an external light, since metal layers inside the display panel can reflect the external light source, rainbow mura will be generated on the display panel, which will affect a display effect of the display panel.

In order to solve the above-mentioned technical problems, an embodiment of the present disclosure provides a display panel. A darkening layer is provided to reduce reflection of the external light from the metal layers inside the display panel, thereby reducing the rainbow mura generated when the external light source irradiates the display panel. Details will be described below.

Figure 1:
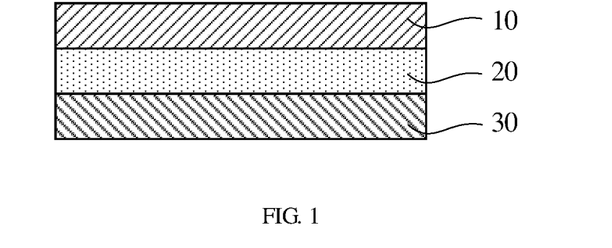
FIG. 1 is a first structural schematic diagram of a display panel provided in an embodiment of the present disclosure.

Please refer to FIG. 1. FIG. 1 is a schematic diagram of a first structure of a display panel provided in an embodiment of the present disclosure. Wherein, the display panel comprises a cover plate 10, a driving circuit layer 20, and a pixel layer 30. The cover plate 10 is located at a light-emitting side of the display panel when displaying. The driving circuit layer 20 is configured to drive the display panel for display—for example, to control brightness and color of the display panel. The pixel layer 30 comprises a plurality of pixel units, and the plurality of pixel units can cooperate with each other to make the display panel display different images.

Figure 2:
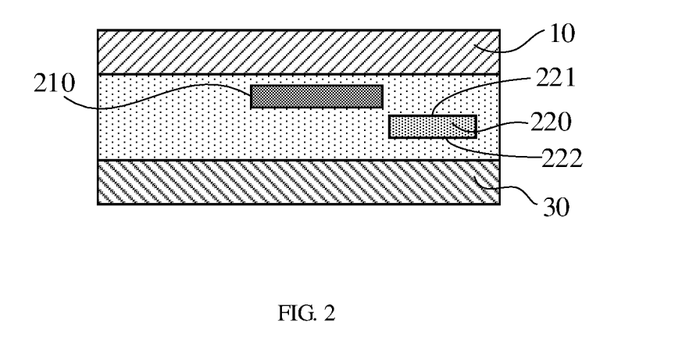
FIG. 2 is a first structural schematic diagram of a driving circuit layer provided in the embodiment of the present disclosure.

Please also refer to FIG. 2. FIG. 2 is a schematic diagram of a first structure of the driving circuit layer provided in the embodiment of the present disclosure. Wherein, the driving circuit layer 20 comprises a metal layer. The metal layer comprises a first metal layer 210 and a second metal layer 220. The first metal layer 210 may be used to form scan lines and gate regions of thin film transistors. The second metal layer 220 may be configured to form source regions, drain regions and data lines of the thin film transistors.

A first insulating layer is disposed between the first metal layer 210 and the cover plate 10, and the first metal layer 210 may be disposed on the first insulating layer.

The second metal layer 220 comprises a first side surface 221 and a second side surface 222. The first side surface 221 is located at a side of the second metal layer 220 towards the cover plate 10, and the second side surface 222 is located at a side of the second metal layer 220 towards the pixel layer 30. The first metal layer 210 is disposed on the first side surface 221 of the second metal layer 220, and an insulating layer and a semiconductor layer are disposed between the first metal layer 210 and the second metal layer 220. For example, the first metal layer 210 is disposed on the second insulating layer, the second insulating layer is disposed on the semiconductor layer, and the semiconductor layer is disposed on the second metal layer 220. The semiconductor layer may include oxides such as indium gallium zinc oxide (IGZO), etc.

When the external light source incidents from the cover plate 10 at different angles, translucent layers formed inside the display panel will provide a certain thickness for light of different wavelengths, so rainbow mura appears on the display panel. When a thin film transistor (TFT) side of the display panel faces outward, the metal layers will reflect part of the light, which causes rainbow mura to appear on the display panel.

Figure 3:
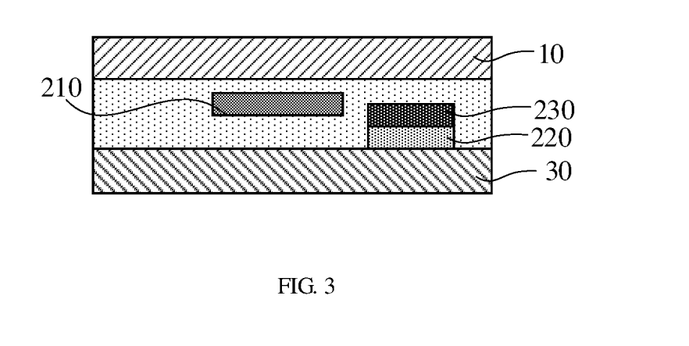
FIG. 3 is a second structural schematic diagram of the driving circuit layer provided in the embodiment of the present disclosure.

In order to solve this problem, in the embodiments of the present disclosure, a darkening layer is provided to reduce reflection of the metal layers, thereby reducing rainbow mura generated when the display panel is illuminated by the external light source. Please refer to FIG. 3 for details. FIG. 3 is a schematic diagram of a second structure of the driving circuit layer 20 provided in the embodiment of the present disclosure.

Wherein, the driving circuit layer 20 further comprises a darkening layer 230, which is disposed between the cover plate 10 and the first metal layer 210 or the second metal layer 220. That is, the darkening layer 230 is disposed on a side of the first metal layer 210 or the second metal layer 220 towards the cover plate 10. The darkening layer 230 can reduce reflection of the external light from the first metal layer 210 and the second metal layer 220, thereby reducing the rainbow mura generated when the display panel is illuminated by the external light source.

The darkening layer 230 may be substances such as metal oxides, metal nitrides, metal oxynitrides, etc. The substances containing metal elements may include molybdenum. For example, the chemical formulas of the substances in the darkening layer 230 may include $Mo_aX_bO_cN_d$. The chemical formulas of the substances in the darkening layer 230 may also include $Mo_aX_bW_c$, $Mo_aX_bC_c$, $Al_aO_bN_c$, etc., and at least one of the substances may be selected as the main constituent substance. In the chemical formulas, a is a rational number greater than 0, b is a rational number greater than or equal to zero, c is a rational number greater than zero, and d is a rational number greater than zero. An X element in the chemical formulas of constituent substances in the darkening layer 230 includes one of tantalum, vanadium, nickel, niobium, zirconium, tungsten, titanium, rhenium, or hafnium.

In the process of producing the darkening layer 230, the darkening layer 230 can be directly selected from corresponding target materials, and then made using physical vapor deposition (PVD) methods, such as vacuum evaporation, sputtering coating methods, etc.

Corresponding metal target materials or corresponding metal alloy target materials may be chosen. In the environment where the metal target materials or metal alloy target materials can undergo chemical reactions, substances such as oxygen, nitrogen, carbon dioxide and the like in the chemical reaction environment can be selected to generate the corresponding substances in the darkening layer 230. For example, metal oxides, metal nitrides, metal oxynitrides and the like are generated.

In some embodiments, a thickness of the darkening layer 230 is too thick, which will also affect the display effect of the display panel. For example, if the thickness of the darkening layer 230 is too thin, the reflection effect of the metal layers cannot be greatly reduced, and therefore the rainbow mura generated when the external light irradiates the display screen cannot be reduced. If the thickness of the darkening layer 230 is too thick, contact resistance between the second metal layer 220 and the semiconductor layer will increase. For example, the second metal layer 220 and the semiconductor layer will change from ohmic contact to Schottky contact, which increases the contact resistance and has a greater impact on electrical properties of the thin film transistors, and eventually causes the display effect of the display panel to deteriorate. Under study of the thickness of the darkening layer 230 in the present disclosure, when the thickness of the darkening layer 230 ranges from 20 nanometers to 60 nanometers, the electrical properties of the thin film transistors will not be affected. Since a reflectivity of the darkening layer to the external light is lower than a reflectivity of the metal layer to the external light, thereby reducing the rainbow mura on the display panel when the external light is irradiated, and improving the display effect of the display panel. In some cases, the thickness of the darkening layer 230 can also be set ranging from 20 to 90 nanometers, which will also reduce the rainbow mura generated when the external light irradiates the display panel. Specifically, the thickness of the darkening layer 230 can be set to 50 nanometers.

In some embodiments, the darkening layer 230 can absorb externally irradiated light, so that the intensity of the light irradiated to the metal layers becomes lower. Finally, when the light reflected by the metal layer passes through the darkening layer 230, the light intensity will be further reduced, thereby reducing the rainbow mura formed on the display panel.

In some embodiments, when the darkening layer 230 is combined with the first metal layer 210 or the second metal layer 220, a composite film layer is formed. The composite film layer can absorb part of the light irradiated by the external light source, and a reflectivity of the layer is lower than a reflectivity of the first metal layer 210 or the second metal layer 220. When the external light irradiates the display panel, less light will be reflected by the composite film layer, thereby reducing rainbow mura formed on the display panel.

The first metal layer 210 shown in FIG. 3 forms a first orthographic projection on the cover plate 10, and the second metal layer 220 forms a second orthographic projection on the cover plate 10. The first orthographic projection and the second orthographic projection are spaced apart. That is, the first metal layer 210 and the second metal layer 220 are not in the same longitudinal space.

The darkening layer 230 can be set in multiple ways. For example, the darkening layer 230 shown in FIG. 3 can be directly arranged on the second metal layer 220 to reduce the reflectivity of the second metal layer 220 of the external light.

Figure 4:
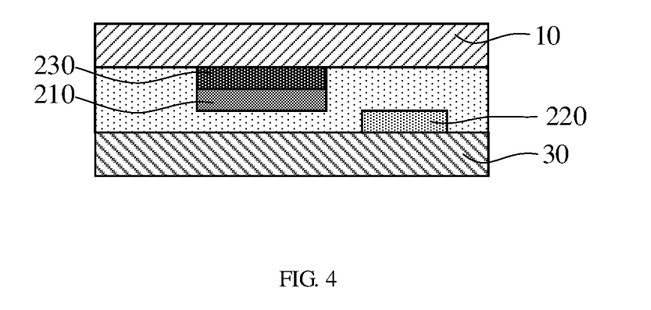
FIG. 4 is a third structural schematic diagram of the driving circuit layer provided in the embodiment of the present disclosure.

Please also refer to FIG. 4. FIG. 4 is a schematic diagram of a third structure of the driving circuit layer 20 provided in the embodiment of the present disclosure.

The first metal layer 210 shown in FIG. 4 forms the first orthographic projection on the cover plate 10, and the second metal layer 220 forms the second orthographic projection on the cover plate 10. The first orthographic projection and the second orthographic projection are spaced apart. That is, the first metal layer 210 and the second metal layer 220 are not in the same longitudinal space.

In some embodiments, since the first metal layer 210 is located closer to the cover plate 10, when the external light irradiates the cover plate 10, the light is more likely to irradiate the first metal layer 210, and the first metal layer 210 is more likely to reflect the external light, so rainbow mura is generated on the display panel. However, the second metal layer 220 is located at a greater distance from the cover plate 10 than the distance between the first metal layer 210 and the cover plate 10, and when external light is irradiated, intensity of the light irradiating the second metal layer 220 is lower. Therefore, the light reflected by the second metal layer 220 is also relatively weak, and it is not easy to generate rainbow mura on the display panel.

Therefore, in FIG. 4, the darkening layer can be directly disposed on the side of the first metal layer 210 towards the cover plate 10 to reduce the reflection of the first metal layer 210. If the second metal layer 220 reflects less external light, the darkening layer 230 may not be provided.

Figure 5:
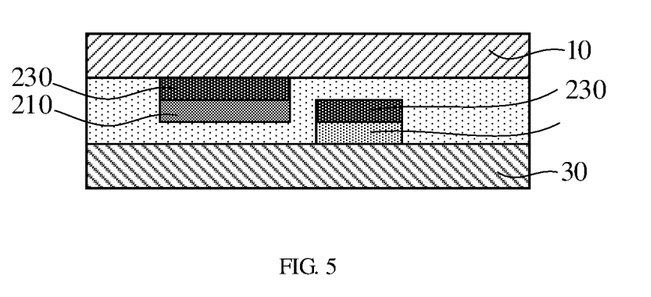
FIG. 5 is a fourth structural schematic diagram of the driving circuit layer provided in the embodiment of the present disclosure.

Please also refer to FIG. 5. FIG. 5 is a schematic diagram of a fourth structure of the driving circuit layer 20 provided in the embodiment of the present disclosure.

The first metal layer 210 shown in FIG. 5 forms the first orthographic projection on the cover plate 10, and the second metal layer 220 forms the second orthographic projection on the cover plate 10. The first orthographic projection and the second orthographic projection are spaced apart. That is, the first metal layer 210 and the second metal layer 220 are not in the same longitudinal space.

Wherein, in order to better prevent rainbow mura from being generated when the external light is irradiated on the display panel, the darkening layer 230 may be disposed on the side of the first metal layer 210 towards the cover plate 10. At the same time, the darkening layer 230 may also be disposed on the first side surface 221 of the second metal layer 220, that is, the darkening layer 230 may be disposed between the second metal layer 220 and the cover plate 10.

When the external light is incident from the cover plate 10 and irradiated inside the display panel, due to the effect of the darkening layer 230, the reflection of the external light from the first metal layer 210 and the second metal layer 220 can be reduced, thereby further reducing the rainbow mura generated when the external light irritated to the display panel.

Figure 6:
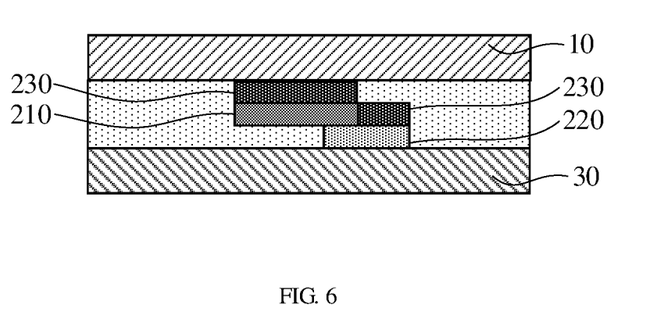
FIG. 6 is a fifth structural schematic diagram of the driving circuit layer provided in the embodiment of the present disclosure.

Please continue to refer to FIG. 6. FIG. 6 is a schematic diagram of a fifth structure of the driving circuit layer 20 provided in the embodiments of the present disclosure.

In some embodiments, the first metal layer 210 forms the first orthographic projection on the cover plate 10, and the second metal layer 220 forms the second orthographic projection on the cover plate 10. The second orthographic projection comprises a first part and a second part, wherein the first part is inside the first orthographic projection, and the second part is outside the first orthographic projection. That is, the first metal layer 210 and the second metal layer 220 are in a longitudinal space, and the first metal layer 210 and the second metal layer 220 have the same longitudinal space.

In this case, the space inside the display panel is narrower, and the display panel is lighter and thinner. When the external light is irradiated, rainbow mura is more likely to appear due to reflection of the metal layer. Therefore, the darkening layer 230 may be disposed between the first metal layer 210 and the cover plate 10. The darkening layer 230 is disposed on the first side surface 221 of the second metal layer 220 corresponding to the second part of the second orthographic projection. That is, the darkening layer 230 is disposed on the side of the second metal layer 220, which corresponds to the second part of the second orthographic projection towards the cover plate 10.

Finally, through disposing the darkening layer 230, when the external light is irradiated, reflection of the external light from the first metal layer 210 and the second metal layer 220 is reduced, thereby reducing the rainbow mura generated by the display panel when the external light is irradiated.

Figure 7:
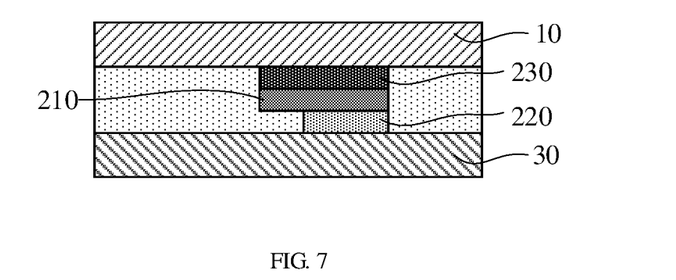
FIG. 7 is a sixth structural schematic diagram of the driving circuit layer provided in the embodiment of the present disclosure.

Please also refer to FIG. 7. FIG. 7 is a schematic diagram of the driving circuit layer 20 provided in the embodiments of the present disclosure.

Wherein, the first metal layer 210 forms the first orthographic projection on the cover plate 10, and the second metal layer 220 forms the second orthographic projection on the cover plate 10. The second orthographic projection is located inside the first orthographic projection. That is, the longitudinal space where the second metal layer 220 is located is inside the longitudinal space where the first metal layer 210 is located.

At this time, when the external light irradiates the display panel through the cover plate 10, the light only irradiates the first metal layer 210, but not the second metal layer 220. At this time, the darkening layer 230 is only needed to be disposed between the first metal layer 210 and the cover plate 10.

Through disposing the darkening layer 230, when the external light is irradiated, reflection of the external light from the first metal layer 210 is reduced, thereby reducing the rainbow mura generated by the display panel when the external light is irradiated.

Figure 8:
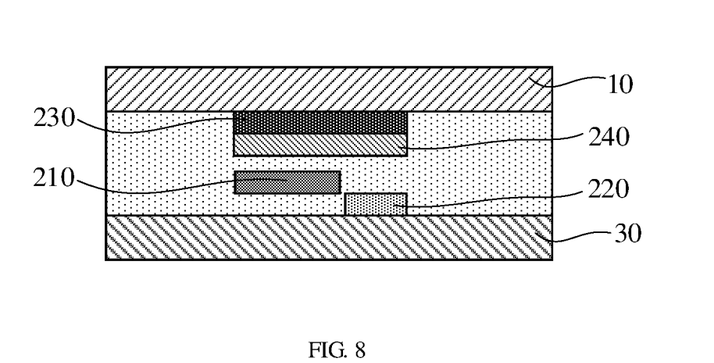
FIG. 8 is a seventh structural schematic diagram of the driving circuit layer provided in the embodiment of the present disclosure.

Please also refer to FIG. 8. FIG. 8 is a schematic diagram of a seventh structure of the driving circuit layer 20 provided in the embodiments of the present disclosure.

Wherein, the first metal layer 210 forms the first orthographic projection on the cover plate 10, and the second metal layer 220 forms the second orthographic projection on the cover plate 10. The second orthographic projection is located inside the first orthographic projection. That is, the longitudinal space where the second metal layer 220 is located is inside the longitudinal space where the first metal layer 210 is located.

In some embodiments, if the darkening layer is directly disposed on the first metal layer 210 and the second metal layer 220, the process is more difficult in actual production. Therefore, an isolation layer 240 may be disposed between the first metal layer 210 and the cover plate 10 first, and the isolation layer 240 may be made of metal materials or non-metal materials.

Then, the darkening layer 230 is disposed between the isolation layer 240 and the cover plate 10. The darkening layer 230 may be disposed on the isolating layer 240 directly. For example, the darkening layer 230 is disposed on the isolating layer 240 through the vacuum sputtering process.

The darkening layer 230 forms a third orthographic projection on the cover plate 10, and the first orthographic projection and the second orthographic projection are inside the third orthographic projection.

When the external light is irradiated, the light is not directly irradiated to the first metal layer 210 and the second metal layer 220 due to a blocking effect of the darkening layer 230. At this time, a light reflection effect of the first metal layer 210 and the second metal layer 220 is very low, and reflectivity of the darkening layer 230 of external light is also very low. Therefore the rainbow mura generated when the external light irradiates the display panel is reduced.

It should be noted that the disposition of the darkening layer 230 can be applied to liquid crystal displays (LCDs) or display panels made in the form of organic light-emitting diodes (OLEDs), namely organic self-luminous display panels.

Figure 9:
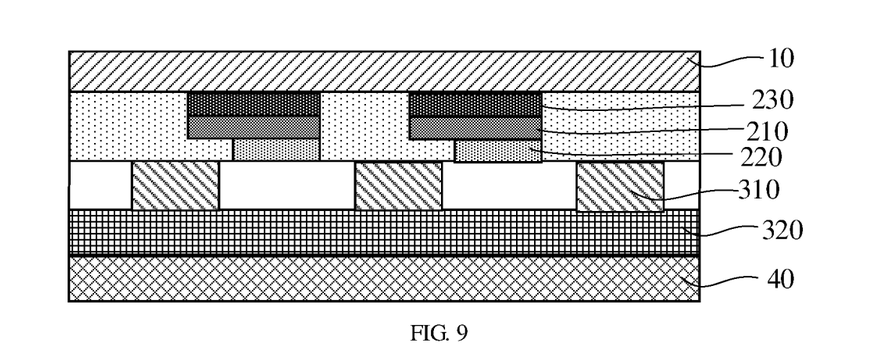
FIG. 9 is a second structural schematic diagram of the display panel provided in the embodiment of the present disclosure.

Please continue to refer to FIG. 9. FIG. 9 is a second schematic diagram of a second structure of the display panel provided in the embodiments of the present disclosure. The display panel is a liquid crystal display panel.

Wherein, the pixel layer 30 comprises a color resist layer 310 and a transparent electrode layer 320. Wherein, a protection layer is also disposed between the color resist layer 310 and the transparent electrode layer 320. The protection layer is configured to protect the transparent electrode layer 320. The material of the transparent electrode layer 320 is preferably indium tin oxide or indium zinc oxide, etc. A liquid crystal layer 40 is disposed on a side of the pixel layer 30 away from the cover plate 10. The transparent electrode layer 320 is adjacent to the liquid crystal layer.

Wherein, the color resist layer 310 comprises R color resists, G color resists, and B color resists. W color resists can also be included. The color resist layer 310 is configured to form a color filter. The color resist layer 310 may be disposed between the thin film transistors and the transparent electrode layer 320, and the color resist layer 310 may serve an insulating function to reduce capacitive coupling between the transparent electrode layer 320 and the thin film transistors.

When the display panel is a liquid crystal display panel, a first insulating layer is disposed between the first metal layer 210 and the second metal layer 220, and a second insulating layer is disposed between the first metal layer 210 and the cover plate 10. The darkening layer 230 is disposed on the first metal layer 210 and/or the second metal layer 220.

Figure 10:
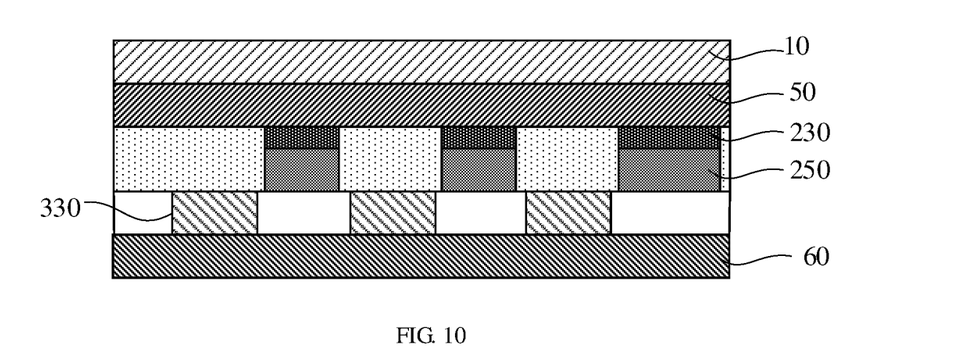
FIG. 10 is a third structural schematic diagram of the display panel provided in the embodiment of the present disclosure.

Please continue to refer to FIG. 10. FIG. 10 is a schematic diagram of a third structure of the display panel provided in the embodiments of the present disclosure. The display panel is an organic self-luminous display panel.

Wherein, an encapsulation layer 50 is further included between the driving circuit layer 20 and the cover plate 10, a third metal layer 250 is included in the driving circuit layer 20, and the darkening layer 230 is disposed on the side of the third metal layer 250 towards the cover plate 10. The pixel layer 30 comprises an organic light-emitting layer 330, and the organic light-emitting layer 330 comprises a plurality of R, G, and B organic self-luminous units. On the side of the pixel layer 30 away from the cover plate 10, a TFT glass layer 60 is provided.

The darkening layer 230 is disposed on the third metal layer 250 and can reduce reflection of light from the third metal layer 250 when the external light is irradiated. Therefore, the rainbow mura generated when the external light irradiates the display panel is reduced.

It should be noted that the display panel provided in the embodiments of the present disclosure only provides a part of the panel structure, and not all the structures of the liquid crystal display panel or the organic self-luminous display panel are shown in the figures. In the present disclosure, through the setting of the darkening layer 230 in the display panel, the reflection of the external light from the metal layer is reduced, thereby reducing the rainbow mura generated when the external light irradiates the display panel. If the darkening layer has the same disposition method, it is in the protection scope of the present disclosure.

The above is a detailed introduction to a display panel provided in the embodiments of the present disclosure. Specific examples are used in this article to illustrate the principles and implementations of the present disclosure. The descriptions of the above embodiments are only used to help understand the methods and core ideas of the present disclosure. At the same time, for those skilled in the art, according to the ideas of the present disclosure, there will be changes in the specific implementation and scope of the present disclosure. In summary, the content of this specification should not be construed as a limitation.

What is claimed is:

1. A display panel, comprising:
    a cover plate;
    a pixel layer; and
    a driving circuit layer disposed between the cover plate and the pixel layer, wherein the driving circuit layer comprises a metal layer and a darkening layer, the darkening layer is disposed on a side of the metal layer towards the cover plate, and a reflectivity of the darkening layer of external light is less than a reflectivity of the metal layer of the external light,
    wherein the metal layer comprises a first metal layer and a second metal layer, and the second metal layer comprises a first side surface and a second side surface, wherein the first side surface is located towards the cover plate, the second side surface is located away from the cover plate, and the first metal layer is disposed on the first side surface of the second metal layer.

2. The display panel of claim 1, wherein the darkening layer comprises at least one of metal oxides, metal nitrides, or metal oxynitrides, and metal elements in the metal oxides, metal nitrides, or metal oxynitrides comprise molybdenum.

3. The display panel of claim 2, wherein chemical formulas of constituent substances of the darkening layer comprise $Mo_aX_bO_cN_d$, wherein an X element in the chemical formulas comprises one element of tantalum, vanadium, nickel, niobium, zirconium, tungsten, titanium, rhenium, or hafnium, wherein in the chemical formula, a, c, d are rational numbers greater than zero, and b is a rational number greater than or equal to zero.

4. The display panel of claim 2, wherein a thickness of the darkening layer ranges from 20 nanometers to 90 nanometers.

5. The display panel of claim 4, wherein the thickness of the darkening layer is 50 nanometers.

6. The display panel of claim 1, wherein a first orthographic projection of the first metal layer on the cover plate is spaced apart from a second orthographic projection of the second metal layer on the cover plate, wherein the darkening layer is disposed on a side of the first metal layer towards the cover plate, and/or the darkening layer is disposed on a side of the second metal layer towards the cover plate.

7. The display panel of claim 1, wherein a second orthographic projection of the second metal layer on the cover plate is located inside a first orthographic projection of the first metal layer on the cover plate, and the darkening layer is disposed on a side of the first metal layer towards the cover plate.

8. The display panel of claim 1, wherein a second orthographic projection of the second metal layer on the cover plate comprises a first part and a second part, wherein the first part is inside a first orthographic projection of the first metal layer on the cover plate, and the second part is outside the first orthographic projection; and
    the darkening layer is disposed on the first side surface of the second metal layer corresponding to the second part, and the darkening layer is disposed on a side of the first metal layer towards the cover plate.

9. The display panel of claim 1, wherein the display panel further comprises:
    an isolation layer disposed between the darkening layer and the first metal layer, and the darkening layer is disposed on a side of the isolation layer towards the cover plate, wherein the first metal layer forms a first orthographic projection on the cover plate, the second metal layer forms a second orthographic projection on the cover plate, and the first orthographic projection and the second orthographic projection are both inside a third orthographic projection of the darkening layer on the cover plate.

10. The display panel of claim 1, wherein a first insulating layer is disposed between the first metal layer and the cover plate.

11. The display panel of claim 10, wherein a second insulating layer is disposed between the first metal layer and the second metal layer.

12. The display panel of claim 11, wherein a semiconductor layer is disposed between the second insulating layer and the second metal layer.

13. The display panel of claim 12, wherein constituent materials of the semiconductor layer comprise indium gallium zinc oxide.

14. The display panel of claim 1, wherein the pixel layer comprises a color resist layer.

15. The display panel of claim 14, wherein the pixel layer further comprises a transparent electrode layer, and the transparent electrode layer is disposed on a side of the color resist layer away from the cover plate.

16. The display panel of claim 15, wherein a protection layer is disposed between the color resist layer and the transparent electrode layer.

17. The display panel of claim 14, wherein the display panel further comprises:

a liquid crystal layer disposed on a side of the pixel layer away from the cover plate.

18. The display panel of claim 1, wherein the pixel layer comprises an organic light-emitting layer, and the organic light-emitting layer comprises a plurality of red, green, and blue organic self-luminous units.

19. The display panel of claim 18, wherein the display panel further comprises:
an encapsulation layer disposed between the cover plate and the driving circuit layer.

* * * * *